United States Patent
Miller et al.

(10) Patent No.: US 6,697,691 B1
(45) Date of Patent: Feb. 24, 2004

(54) METHOD AND APPARATUS FOR FAULT MODEL ANALYSIS IN MANUFACTURING TOOLS

(75) Inventors: Michael L. Miller, Cedar Park, TX (US); Terrence J. Riley, Austin, TX (US); Qingsu Wang, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/476,895

(22) Filed: Jan. 3, 2000

(51) Int. Cl.[7] .................... G06F 19/00; G06F 11/30
(52) U.S. Cl. .................... 700/108; 700/121; 702/183
(58) Field of Search .................... 700/79–81, 108–110, 700/117, 121; 365/200, 201; 714/718, 720, 724, 734–737, 742–745, 799; 702/35, 81–84, 182–185; 438/14

(56) References Cited

U.S. PATENT DOCUMENTS

| | | | |
|---|---|---|---|
| 5,859,964 A | * | 1/1999 | Wang et al. .................... 714/48 |
| 6,192,287 B1 | * | 2/2001 | Solomon et al. ............. 700/110 |
| 6,484,064 B1 | * | 11/2002 | Campbell .................... 700/100 |
| 6,532,555 B1 | | 3/2003 | Miller et al. .................. 714/48 |
| 6,556,881 B1 | * | 4/2003 | Miller ......................... 700/108 |

OTHER PUBLICATIONS

Triant Technologies, Inc. website, "Our Products—ModelWare/RT Overview," 1996–1999, (http://www.triant.com/content–products.html).*

* cited by examiner

*Primary Examiner*—Maria N. Von Buhr
(74) *Attorney, Agent, or Firm*—Williams, Morgan & Amerson, P.C.

(57) ABSTRACT

The present invention provides for a method and an apparatus for fault model analysis in manufacturing tools. A sequence of semiconductor devices is processed through a manufacturing process. Production data resulting from the processing of the semiconductor devices is acquired. A fault model analysis is performed using the acquired production data.

42 Claims, 5 Drawing Sheets

US 6,697,691 B1

METHOD AND APPARATUS FOR FAULT MODEL ANALYSIS IN MANUFACTURING TOOLS

BACKGROUND OF THE INVENTION

1. Field of the Invention

This invention relates generally to semiconductor products manufacturing, and, more particularly, to a method and apparatus for performing fault model analysis in manufacturing tool operations.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Among the important aspects in semiconductor device manufacturing are rapid thermal anneal (RTA) processing control, chemical-mechanical polishing (CMP) control, and overlay control. The RTA process involves rapidly heating a semiconductor wafer in order to repair the silicon crystal lattice of the semiconductor device. Generally, the total energy transferred to the wafer is important because it affects ion concentration in the semiconductor device. The ion concentration in the semiconductor device affects the electrical properties of the semiconductor device. Currently, process control of rapid thermal processes includes resistivity test wafers that are run on a predetermined frequency and wafer electrical test (WET) measurements made on product wafers.

Changes in processing tools, or in the process itself, can greatly impact final device quality. However, processing tool changes and process changes can be difficult to detect using current control techniques. Furthermore, using current control techniques, detecting processing tool changes and process changes is difficult to perform without jeopardizing a large amount of product wafers.

Generally, an RTA process tool processes semiconductor wafers on an individual basis. An equipment interface (not shown) is used by an Manufacturing Execution System (MES) to control the RTA process tool. The equipment interface is also connected to a process control system, such as the Advanced Process Control (APC) framework, to allow the APC system to collect real-time trace data from the RTA process tool. Furthermore, the APC system is capable of interrupting processing of semiconductor wafers when necessary. The current system of checking for error on product of sample wafer and making correction can cause inefficiencies and errors in the manufactured semiconductor devices.

The present invention is directed to overcoming, or at least reducing the effects of, one or more of the problems set forth above.

SUMMARY OF THE INVENTION

In one aspect of the present invention, a method is provided for fault model analysis in manufacturing tools. A sequence of semiconductor devices is processed through a manufacturing process. Production data resulting from the processing of the semiconductor devices is acquired. A fault model analysis is performed using the acquired production data.

In another aspect of the present invention, an apparatus is provided for fault model analysis in manufacturing tools. The apparatus of the present invention comprises: means for processing a sequence of semiconductor devices through a manufacturing process; means for acquiring production data resulting from the processing of the semiconductor devices; and means for performing a fault model analysis using the acquired production data.

BRIEF DESCRIPTION OF THE DRAWINGS

The invention may be understood by reference to the following description taken in conjunction with the accompanying drawings, in which like reference numerals identify like elements, and in which.

Figure 1:
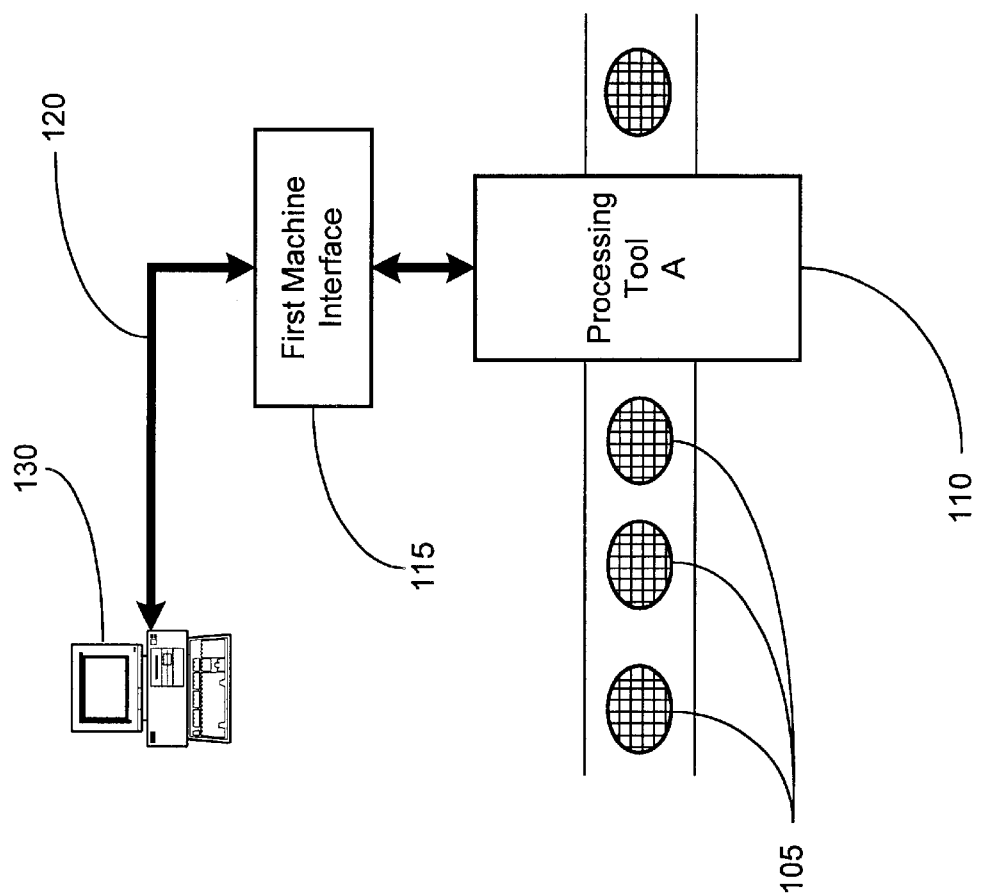
FIG. 1 illustrates one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, semiconductor devices are stepped through multiple manufacturing process tools. As semiconductor devices are processed through manufacturing tools, production data is generated. The production data can be used to perform fault detection analysis, which can lead to improved manufacturing results. Rapid thermal processing (RTA) is an important group of process steps in semiconductor manufacturing. Improvements in the RTA process could result in substantial enhancements, in terms of quality and efficiency, in semiconductor manufacturing processes. The present invention provides a method of acquiring production data and performing fault model analysis in response to the acquired production data.

Turning now to FIG. 1, one embodiment of the present invention is illustrated. In one embodiment, semiconductor products 105, such as semiconductor wafers, are processed on a processing tool 110 using a plurality of control input signals on a line 120. In one embodiment, the control input signals on the line 120 are sent to the processing tool 110 from a computer system 130 via the machine interface 115. In one embodiment, the machine interface 115 is located outside the processing tool 110. In an alternative embodiment, the machine interface 115 is located within the processing tool 110.

In one embodiment, the computer system 130 sends control input signals on the line 120 to the machine interface 115. The control input signals on the line 120 that are intended for the processing tool 110 are received and processed by the machine interface 115. Examples of the processing tool 110 used in semiconductor manufacturing processes are RTA process tools.

In one embodiment, prior to performing a manufacturing processing run on semiconductor wafers, a control system, such as the APC framework, issues a request that real-time manufacturing measurement data be collected by the processing tool 110. In one embodiment, the control system that makes such a request is resident in the computer system 130. The real-time manufacturing measurement data that is collected by the processing tool 110 is carried through the machine interface 115 via the line 120.

In one embodiment, the processing tool 110 processes each semiconductor wafer in a manufacturing lot. When the processing tool 110 substantially completes processing a semiconductor wafer, the processing tool 110 sends the collected manufacturing data to the machine interface 115. In one embodiment, the machine interface 115 sends the collected manufacturing data to a control system, which in one embodiment resides in the computer system 130, via the line 120. The control system, such as the APC framework, then performs analysis upon the collected manufacturing data. Adjustments to control input signals, which control the manufacturing processes performed by the processing tool 110, can be made in response to the analysis that is performed on the collected manufacturing data.

The control input signals that control the manufacturing processes performed by the processing tool 110 generally affect the accuracy of the process steps performed by the processing tool 110 on semiconductor wafers. Modifications of the control input signals can be utilized to improve the performance of the process steps employed in the manufacturing tool. Many times, errors that are found in the processed semiconductor products 105 can be correlated to a particular fault analysis and corrective actions can be taken to reduce the errors.

Figure 2:
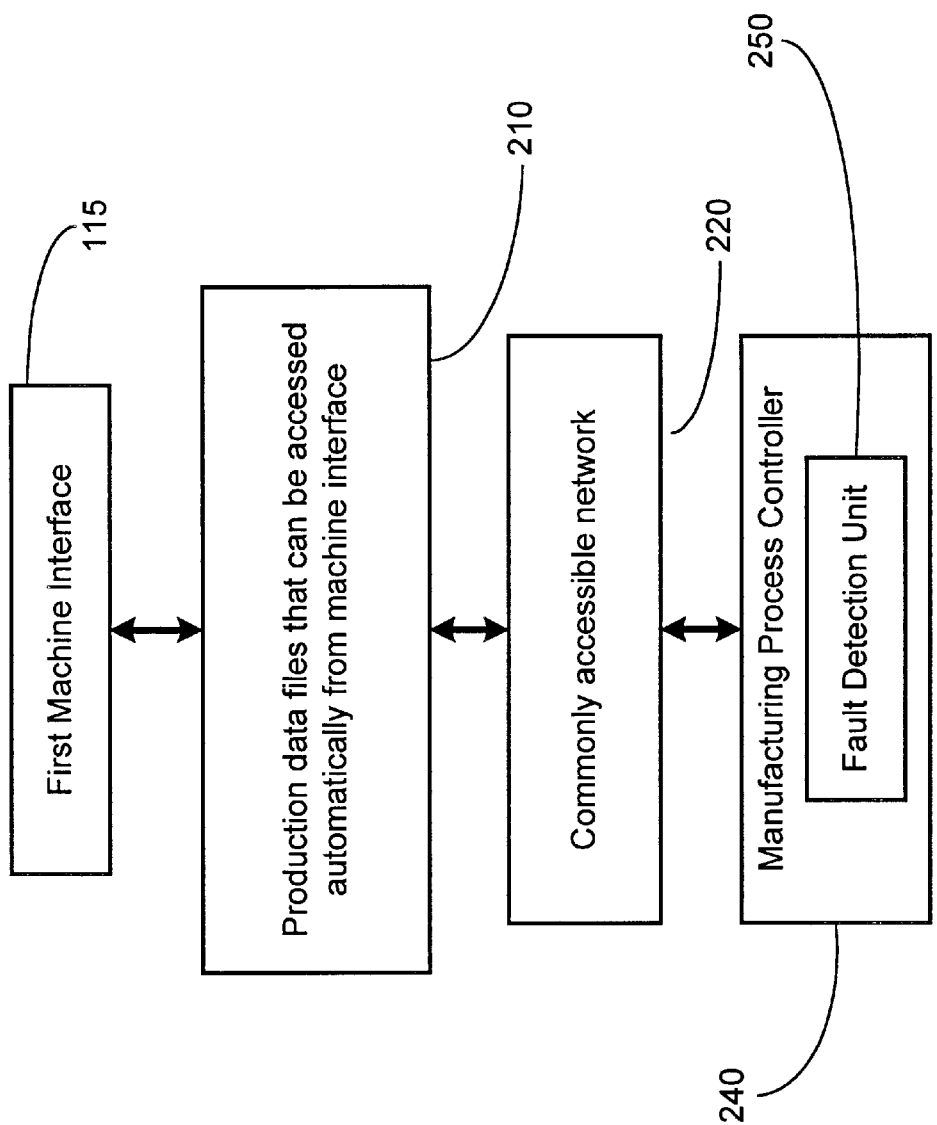
FIG. 2 illustrates one embodiment of the organization for the data acquisition methods taught by the present invention.

Turning now to FIG. 2, a block diagram representation of one embodiment of the organization required for the data acquisition methods taught by the present invention is illustrated. In one embodiment, the machine interface 115 generates a set of production data files that contain manufacturing information that corresponds to a particular run of semiconductor devices or wafers, as shown in block 210 of FIG. 2. In one embodiment, the production data files that are created by the machine interface 115 are accessed automatically from the machine interface 115. In other words, data from the machine interface 115 can be stored directly, through software and hardware control, into an electronic storage media (not shown). In one embodiment, the electronic storage media is located within, or is accessible by, a commonly accessible network 220. Therefore, the computer system 130, which in one embodiment is connected to the commonly accessible network 220, is capable of automatically accessing the production data files generated by the machine interface 115.

In one embodiment, a manufacturing process controller 240 is connected to the commonly accessible network 220. The manufacturing process controller 240 is capable of examining the production data from the machine interface 115. The manufacturing process controller 240, in one embodiment, is controlled by the computer system 130. Generally, the manufacturing process controller 240 is capable of sorting the production data files from the machine interface 115 and correlating them to particular processing runs of semiconductor devices. In one embodiment, the manufacturing process controller 240 is comprised of the Advanced Process Control (APC) framework. In one embodiment, the machine interface 115 is incorporated into the APC framework. In one embodiment, the manufacturing process controller 240 is used to implement the methods taught by the present invention.

Figure 3:
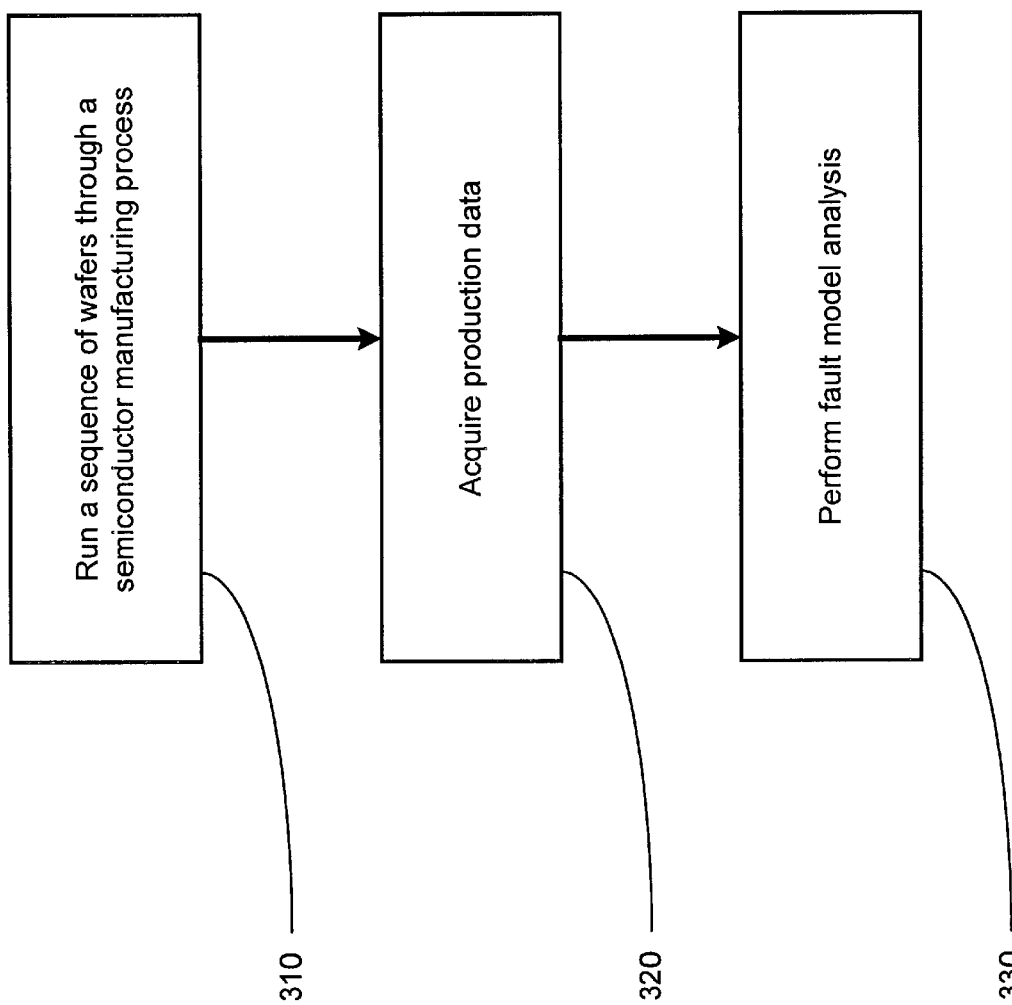
FIG. 3 illustrates a flowchart representation of the methods taught by the present invention.

Turning now to FIG. 3, a flowchart representation of the methods taught by the present invention is illustrated. Initially, a process sequence of semiconductor devices, such as semiconductor wafers, is run through a manufacturing process, as shown in block 310 of FIG. 3. As described above, production data is created by the processing tool 110 and collected by the machine interface 115. Once a process sequence of semiconductor devices is run through a manufacturing process, the corresponding production data is acquired, as described in block 320 of FIG. 3. One embodiment of a more detailed illustration of the step of acquiring production data, described in FIG. 3, is illustrated in FIG. 4.

Figure 4:
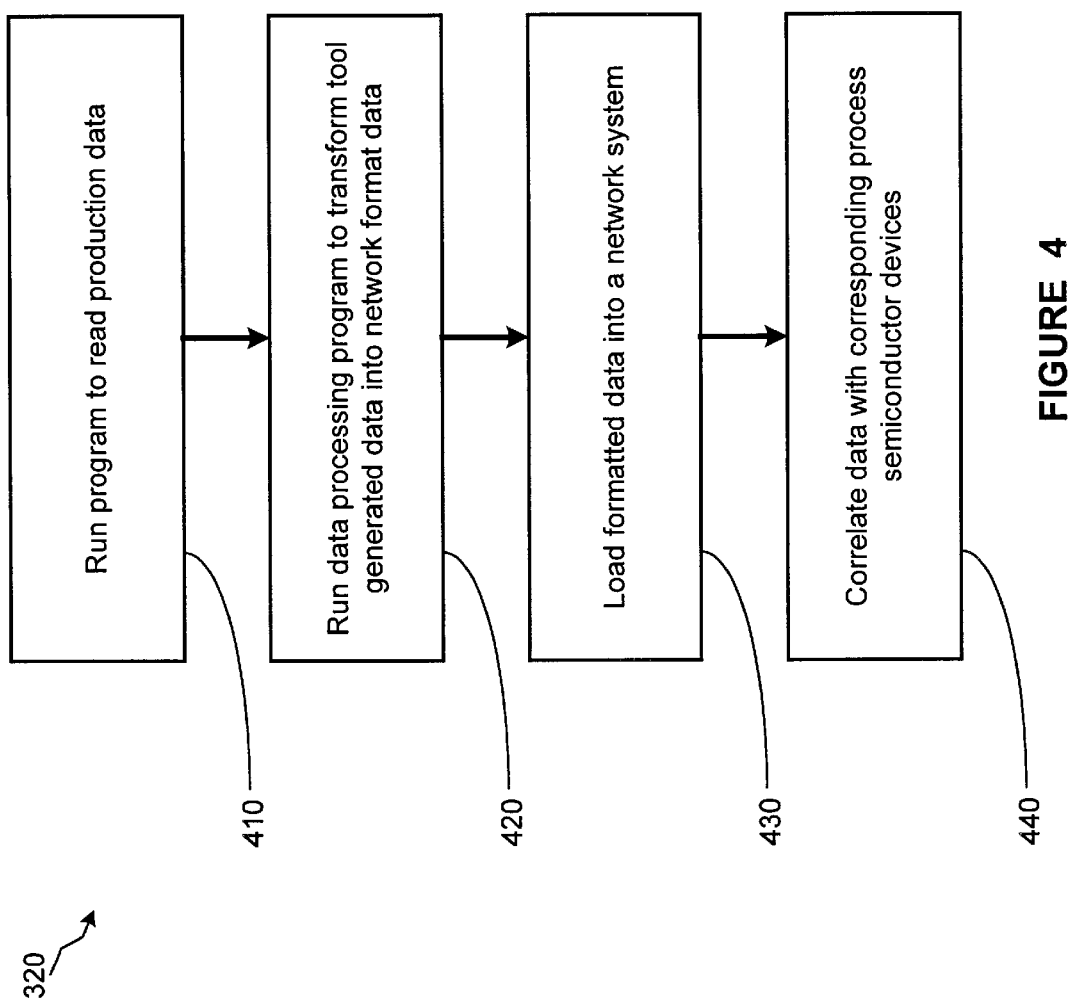
FIG. 4 depicts a more detailed illustration of the step of acquiring error data described in FIG. 3.

Turning now to FIG. 4, a data read program, which in one embodiment is a computer program, is run to read production data generated by the processing tools 110, as described in block 410. In one embodiment, the data read program is controlled by the manufacturing process controller 240 and the computer system 130. To retrieve data from a manufacturing process that was performed on the processing tool 110, the manufacturing process controller 240 runs the computer program that extracts production data files automatically from the machine interface 115 through the commonly accessible network 220, as illustrated in FIG. 2. In other words, the manufacturing process controller 240 utilizes the commonly accessible network 220 to run the data read program and retrieve production data files.

In one embodiment, to retrieve data from a manufacturing process that was performed on the processing tool 110, the manufacturing process controller 240 runs the data acquisition utility to manually collect production data files from the machine interface 115, as illustrated in FIG. 2. Once the production data files from the machine interface 115 are collected, the production data files can be accessed through the commonly accessible network 220. The manufacturing process controller 240 then runs the data read program that reads the production data files that were collected by the data acquisition utility.

Once the production data files are read by the data read program that is utilized by the manufacturing process controller 240, a data processing program is executed to reformat the production data files, as described in block 420 of FIG. 4. In one embodiment, the data processing program is controlled by the manufacturing process controller 240 and the computer system 130. Reformatting the production data files is often required because of the fact that the production data files are generally in raw data format. In one embodiment, the data processing program converts the raw production data files into network formatted data, which may also be in a fault model recognized data format.

In one embodiment, the data processing program translates the raw production data files into a format that is recognizable by a fault detection program in a manner that is well known to those of ordinary skill in the art having the benefit of the present disclosure. In accordance with one embodiment, the fault detection program includes a commercially available software package, such as ModelWare®, for example, that provides fault detection analysis of the production data from the processing tool 110. It will be appreciated, however, that other types of commercially available fault detection software, or other in-house developed fault detection models, could also be used in lieu thereof without departing from the spirit and scope of the present invention.

Once the raw production data files are converted into formatted data, the formatted production data files are loaded into the commonly accessible network 220, as described in block 430 of FIG. 4. Once the formatted production data files are loaded into the commonly accessible network 220, the data files can then be manipulated for further processing. The formatted production data files are then correlated with corresponding manufacturing process sequences of particular manufacturing lots of semiconductor devices, as described in block 440 of FIG. 4.

At this point, formatted production data files are arranged in order, thereby completing the step of acquiring production data that is described in block 320 of FIG. 3. Once production data is acquired, a fault model analysis is performed, as described in block 330 of FIG. 3. A more detailed illustration of performing the step of fault model analysis, described in block 330 of FIG. 3, is depicted in FIG. 5.

Figure 5:
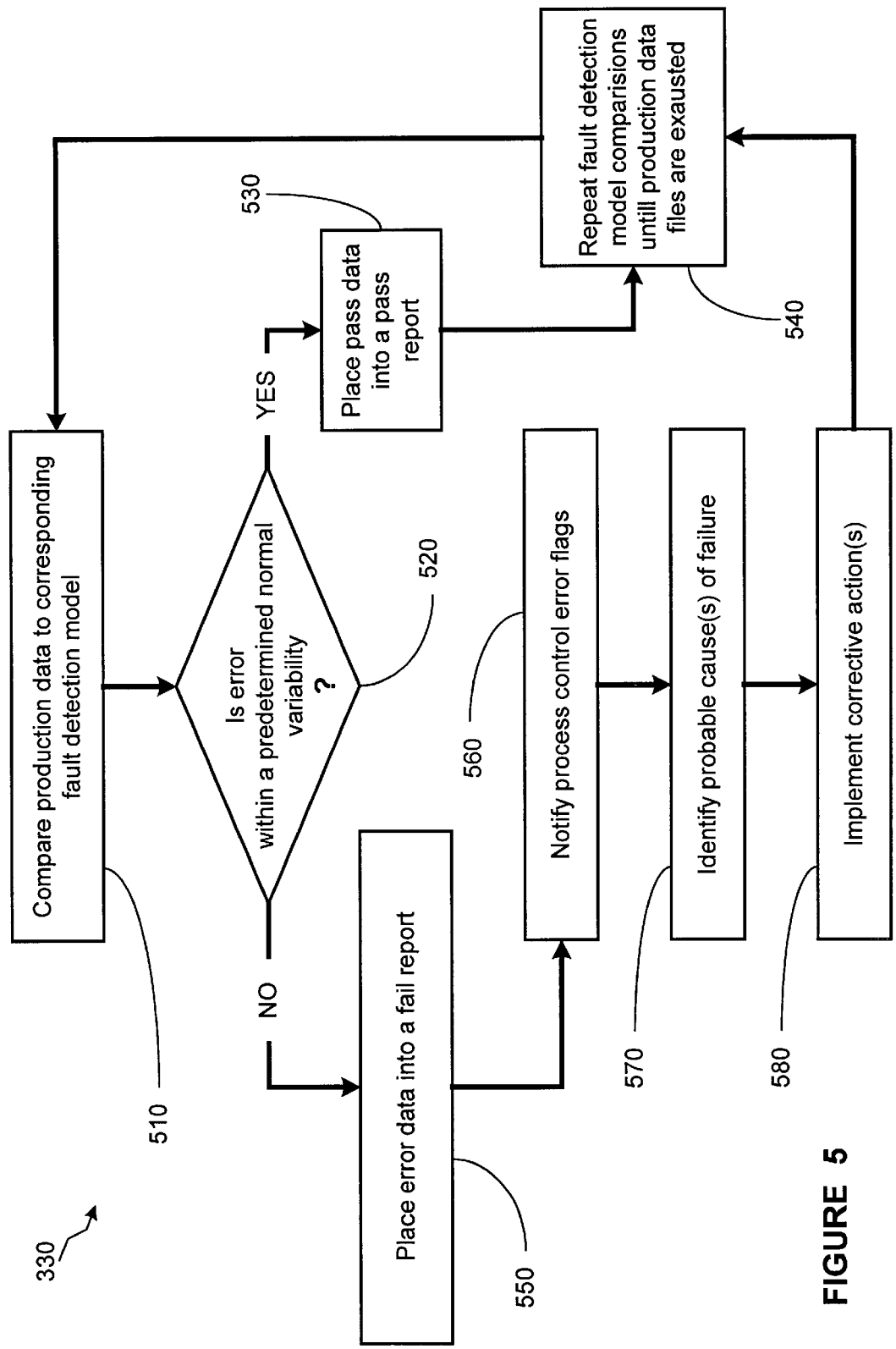
FIG. 5 depicts a more detailed illustration of the step of performing fault model analysis described in FIG. 3.

Turning now to FIG. 5, the formatted production data is compared to a fault detection model, as described in block 510. In one embodiment, the fault detection model comprises a predetermined set of parameters that are approximate ideal process behavior patterns. In one embodiment, the manufacturing process controller 240 comprises a fault detection unit 250 (shown in FIG. 2) which performs fault detection model comparisons. In one embodiment, the fault detection unit 250 is capable of accessing formatted production data files and comparing them to a corresponding fault detection model.

The fault detection unit 250 compares the received formatted production data files to a fault detection model. The fault detection model includes operational data from processing tool(s) 110 where it was previously known that such tools have operated within acceptable operational limits. The types of faults that could be detected by the fault detection unit 250 include processing and/or operational faults in silicon wafer fabrication. Examples of processing faults in an RTP may include, but are not limited to, non-optimal preheating of the chamber causing first wafer effects, catastrophic failure due to a broken wafer, abnormal process gas flow rate, temperature overshoots at the top of a ramp, tube temperature measurement drifts, etc. Some examples of operational faults detected by the fault detection unit 250 may include interrupted/resumed processing, no wafer sleuth (the ordering of semiconductor wafers in a cassette) or improper wafer sleuth prior to Rapid Thermal Anneal (RTA), etc.

The fault detection unit 250, upon evaluating the operational data sent from the APC framework, sends the results of potential faults and/or proper operation of the processing tool 110 to the APC framework. The APC framework, in turn, may direct the computer system 130 to send control signals on the line 120 to the machine interface 115 to control the processing tool 110 based upon the results forwarded from the fault detection unit 250. For example, the control signal from the APC framework may be to shut down the processing tool 110 to prevent any additional faulty production of wafers (providing this was determined by the fault detection unit 250).

Once the comparison between the received production data and the fault detection model is performed, a determination is made whether the differences found between the received production data and the fault detection model data is within a predetermined normal variability, as described in block 520 of FIG. 5. In one embodiment, a summary statistic is generated when the fault detection unit 250 performs a comparison between the received production data and the fault detection model. The summary statistic reflects the magnitude of the difference found between the received production data and the fault detection model data. The summary statistic is used to determine whether the differences between the received production data and the fault detection model data are within an acceptable variability. When the summary statistic corresponding to a particular processed semiconductor wafer is within a predetermined limit, that particular semiconductor wafer is deemed to have passed. When the summary statistic corresponding to a particular processed semiconductor wafer is not within a predetermined limit, that particular semiconductor wafer is deemed to have failed.

When a determination is made that the differences between received production data and the fault detection model is within an acceptable variability, a message indicating the passing of a process run of semiconductor devices is placed into a pass data report, as described in block 530 of FIG. 5. When a fault detection model comparison results in a passing of a semiconductor wafer, fault detection model comparisons of other production data files are performed, as described in block 540 of FIG. 5. The fault detection model comparisons are generally repeated until received production data files are exhausted.

When a determination is made that the differences between received production data and the fault detection model is not within an acceptable variability, a message indicating the failure of a process run of semiconductor devices is placed into a failure data report, as described in block 550 of FIG. 5. In one embodiment, the magnitude of the failure of a semiconductor wafer is also noted in the failure report. For example, a summary statistic of a particular semiconductor wafer that is two times the predetermined variability limit is a lower failure magnitude than a summary statistic of a semiconductor wafer that is ten times the predetermined variability limit. The magnitude of the failure can be used to determine the corrective action that should be taken to reduce further failures.

Once the failure of a semiconductor wafer is placed into the failure data report, an error flag is set informing a "fab"

technician or an engineer that a semiconductor wafer failure within the current lot being examined, has been detected, as described in block 560 of FIG. 5. In one embodiment, the error flag being set will result in a computer message that is sent to a fab technician or an engineer. Generally, in response to the error flag, a possible cause, or causes, of the failure is identified, as described in block 570 of FIG. 5. Once possible causes of failure are identified, a corrective action sequence is implemented, as described in block 580 of FIG. 5.

A number of corrective actions can be implemented to reduce failure of semiconductor wafers during manufacturing processes. For example, lamps in rapid thermal processes could be changed and sensors associated with the processing tool 110 could be recalibrated. Modifying control input signals for subsequent processing of semiconductor devices is also an example of corrective actions that can be implemented to reduce production failures. In some instances, the fault detection model itself may be modified as part of a corrective action, because the fault detection model may have become aged or stale. In other words, changes in manufacturing processes due to the aging of processing tool 110 may render the fault detection model inaccurate, thereby requiring a modification to reflect ideal performance approximations. Furthermore, one appropriate corrective action may be to not take any action at all because of a determination that the failures may have occurred simply because of a defective lot of semiconductor devices. Other corrective actions known by those skilled in the art may also be implemented to reduce failure of semiconductor devices during manufacturing processes.

When the corrective action sequence is concluded, fault detection model comparisons of other production data files are performed, as described in block 540 of FIG. 5. The fault detection model comparisons are generally repeated until received production data files are exhausted. At this point, the step of performing fault model analysis described in block 330 of FIG. 3 is concluded. The principles taught by the present invention can be implemented into other types of manufacturing frameworks.

The principles taught by the present invention can be implemented in an Advanced Process Control (APC) Framework. The APC is a preferred platform from which to implement the overlay control strategy taught by the present invention. In some embodiments, the APC can be a factory-wide software system, therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller. The control methods are generally defined and performed in these scripts. The development of these scripts can comprise a significant portion of the development of a control system.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   processing a sequence of semiconductor devices through a manufacturing process;
   acquiring production data resulting from said processing of said semiconductor devices; and
   performing a fault model analysis using said acquired production data, performing said fault model analysis comprising determining an error based upon said production data and a corresponding fault detection model, categorizing data into one of a pass category and a fail category, reporting at least one of said pass and fail category, and modifying a process control action based upon said error.

2. The method described in claim 1, processing a sequence of semiconductor devices through a manufacturing process further comprises processing semiconductor wafers.

3. The method described in claim 2, wherein processing semiconductor wafers further comprises using a rapid thermal processing tool.

4. The method described in claim 2, wherein processing semiconductor wafers further comprises using a photolithography tool.

5. The method described in claim 2, wherein processing semiconductor wafers further comprises using a chemical-mechanical polishing (CMP) tool.

6. The method described in claim 2, wherein processing semiconductor wafers further comprises using an advanced process control framework.

7. The method described in claim 1, wherein acquiring production data resulting from said processing of said semiconductor devices further comprises:
   executing a data read program for reading said production data;
   executing a data processing program for converting said read production data from a processing tool data format to a network data format;
   loading said converted production data into a network system; and
   correlating said converted production data on said network system with corresponding manufacturing processes of semiconductor devices.

8. The method described in claim 7, wherein executing a data read program for reading said production data further comprises executing a data read program that is a computer program controlled by a manufacturing process controller.

9. The method described in claim 8, wherein executing a data read program that is a computer program controlled by a manufacturing process controller further comprises executing a data read program controlled by an automatic process control system.

10. The method described in claim 7, wherein executing a data read program for reading said production data further comprises reading files of said production data automatically from a machine interface.

11. The method described in claim 7, wherein executing a data read program for reading said production data further comprises executing a data acquisition utility to manually collect files of said production data files from a machine interface.

12. The method of claim 7, wherein executing a data processing program for converting said read production data from a processing tool data format to a network data format further comprises executing a data processing program that is a computer program that is controlled by a manufacturing process controller.

13. The method of claim 12, wherein executing a data processing program that is computer program that is controlled by a manufacturing process controller further comprises executing a data processing program that is a computer program that is controlled by an automatic process control system.

14. The method of claim 7, wherein executing a data processing program for converting said read production data from a processing tool data format to a network data format further comprises converting said production data into format that is recognizable by a fault detection program.

15. The method of claim 7, wherein loading said converted production data into a network system further comprises loading said converted production data into a commonly accessible network.

16. The method of claim 1, wherein performing a fault model analysis using said acquired production data further comprises:
    comparing said production data to a corresponding fault detection model to determine an error;
    determining whether an error detected from said comparison of said production data is within a predetermined normal variability;
    placing data relating to said determined error into a pass data report in response to a determination that said error detected from said comparison of said production data is within said predetermined normal variability;
    placing data relating to said determined error into a failure data report in response to a determination that said error detected from said comparison of said production data is not within said predetermined normal variability;
    notifying at least one process control error flag of said error in response to a determination that said error detected from said comparison of said production data is not within said predetermined normal variability;
    identifying at least one probable cause of failure in response to said notification of said process control error flag; and
    implementing at least one corrective action.

17. The method of claim 16, wherein comparing said production data to a corresponding fault detection model to determine an error further comprises comparing a summary statistic of said production data to said fault detection model.

18. The method of claim 16, wherein notifying at least one process control error flag of said error in response to a determination that said error detected from said comparison of said production data is not within said predetermined normal variability further comprises notifying a fabrication technician of said error.

19. The method of claim 16, wherein implementing at least one corrective action further comprises modifying at least one control signal that controls a manufacturing process.

20. The method of claim 16, wherein implementing at least one corrective action further comprises modifying at least one manufacturing tool characteristic.

21. The method of claim 16, wherein implementing at least one corrective action further comprises modifying at least one characteristic of said fault detection model.

22. An apparatus, comprising:
    means for processing a sequence of semiconductor devices through a manufacturing process;
    means for acquiring production data resulting from said processing of said semiconductor devices; and
    means for performing a fault model analysis using said acquired production data, means for performing said fault model analysis comprising means for determining an error based upon said production data and a corresponding fault detection model, means for categorizing data into one of a pass category, and a fail category, means for reporting at least one of said pass and fail category, and means for modifying a process control action based upon said error.

23. A computer readable program storage device encoded with instructions that, when executed by a computer, performs a method, comprising:
    providing instructions to a manufacturing means for processing a sequence of semiconductor devices through a manufacturing process;
    acquiring production data resulting from said processing of said semiconductor devices; and
    performing a fault model analysis using said acquired production data, performing said fault model analysis comprising determining an error based upon said production data and a corresponding fault detection model, categorizing data into one of a pass category and a fail category, reporting at least one of said pass and fail category, and modifying a process control action based upon said error.

24. The computer readable program storage device encoded with instructions that, when executed by a computer, performs the method described in claim 23, wherein providing instructions to a manufacturing means for processing a sequence of semiconductor devices through a manufacturing process further comprises providing instructions to a manufacturing means for processing semiconductor wafers.

25. The computer readable program storage device encoded with instructions that, when executed by a computer, performs the method described in claim 24, wherein providing instructions to a manufacturing means for processing semiconductor wafers further comprises using an advanced process control framework.

26. The computer readable program storage device encoded with instructions that, when executed by a computer, performs the method described in claim 23, wherein acquiring production data resulting from said processing of said semiconductor devices further comprises:
    executing a data read program for reading said production data;
    executing a data processing program for converting said read production data from a processing tool data format to a network data format;
    loading said converted production data into a network system; and
    correlating said converted production data on said network system with corresponding manufacturing processes of semiconductor devices.

27. The computer readable program storage device encoded with instructions that, when executed by a computer, performs the method described in claim 26, wherein executing a data read program for reading said production data further comprises executing a data read program that is a computer program controlled by a manufacturing process controller.

28. The computer readable program storage device encoded with instructions that, when executed by a computer, performs the method described in claim 27, wherein executing a data read program that is a computer program controlled by a manufacturing process controller further comprises executing a data read program controlled by an automatic process control system.

29. The computer readable program storage device encoded with instructions that, when executed by a computer, performs the method described in claim 26, wherein executing a data read program for reading said production data further comprises reading files of said production data automatically from a machine interface.

30. The computer readable program storage device encoded with instructions that, when executed by a computer, performs the method described in claim 26, wherein executing a data read program for reading said production data further comprises executing a data acquisition utility to manually collect files of said production data files from a machine interface.

31. The computer readable program storage device encoded with instructions that, when executed by a computer, performs the method of claim 28, wherein executing a data processing program for converting said read production data from a processing tool data format to a network data format further comprises executing a data processing program that is computer program that is controlled by a manufacturing process controller.

32. The computer readable program storage device encoded with instructions that, when executed by a computer, performs the method of claim 31, wherein executing a data processing program that is a computer program that is controlled by a manufacturing process controller further comprises executing a data processing program that is computer program that is controlled by an automatic process control system.

33. The computer readable program storage device encoded with instructions that, when executed by a computer, performs the method of claim 26, wherein executing a data processing program for converting said read production data from a processing tool data format to a network data format further comprises converting said production data into format that is recognizable by a fault detection program.

34. The computer readable program storage device encoded with instructions that, when executed by a computer, performs the method of claim 26, wherein loading said converted production data into a network system further comprises loading said converted production data into a commonly accessible network.

35. The computer readable program storage device encoded with instructions that, when executed by a computer, performs the method of claim 23, wherein performing a fault model analysis using said acquired production data further comprises:

comparing said production data to a corresponding fault detection model to determine an error;

determining whether an error detected from said comparison of said production data is within a predetermined normal variability;

placing data relating to said determined error into a pass data report in response to a determination that said error detected from said comparison of said production data is within said predetermined normal variability;

placing data relating to said determined error into a failure data report in response to a determination that said error detected from said comparison of said production data is not within said predetermined normal variability;

notifying at least one process control error flag of said error in response to a determination that said error detected from said comparison of said production data is not within said predetermined normal variability;

identifying at least one probable cause of failure in response to said notification of said process control error flag; and implementing at least one corrective action.

36. The computer readable program storage device encoded with instructions that, when executed by a computer, performs the method of claim 35, wherein comparing said production data to a corresponding fault detection model to determine an error further comprises comparing a summary statistic said production data to said fault detection model.

37. The computer readable program storage device encoded with instructions that, when executed by a computer, performs the method of claim 35, wherein notifying at least one process control error flag of said error in response to a determination that said error detected from said comparison of said production data is not within said predetermined normal variability further comprises notifying a fabrication technician of said error.

38. The computer readable program storage device encoded with instructions that, when executed by a computer, performs the method of claim 35, wherein implementing at least one corrective action further comprises modifying at least one control signal that controls a manufacturing process.

39. The computer readable program storage device encoded with instructions that, when executed by a computer, performs the method of claim 35, wherein implementing at least one corrective action further comprises modifying at least one manufacturing tool characteristic.

40. The computer readable program storage device encoded with instructions that, when executed by a computer, performs the method of claim 35, wherein implementing at least one corrective action further comprises modifying at least one characteristic of said fault detection model.

41. An apparatus, comprising:

a controller to acquire production data resulting from processing one or more semiconductor wafers and to perform a fault model analysis using said acquired production data, performing said fault model analysis comprising determining an error based upon said production data and a corresponding fault detection model, categorizing data into one of a pass category and a fail category, reporting at least one of said pass and fail category, and modifying a process control action based upon said error.

42. The apparatus of claim 41, wherein said controller further comprises:

means for comparing said production data to a corresponding fault detection model to determine an error;

means for determining whether an error detected from said comparison of said production data is within a predetermined normal variability;

means for placing data relating to said determined error into a pass data report in response to a determination that said error detected from said comparison of said production data is within said predetermined normal variability;

means for placing data relating to said determined error into a failure data report in response to a determination that said error detected from said comparison of said production data is not within said predetermined normal variability;

means for notifying at least one process control error flag of said error in response to a determination that said error detected from said comparison of said production data is not within said predetermined normal variability;

means for identifying at least one probable cause of failure in response to said notification of said process control error flag; and means for implementing at least one corrective action.

* * * * *

UNITED STATES PATENT AND TRADEMARK OFFICE
CERTIFICATE OF CORRECTION

PATENT NO.    : 6,697,691 B1
DATED         : February 24, 2004
INVENTOR(S)   : Michael L. Miller and Terrence J. Riley It is certified that error appears in the above-identified patent and that said Letters Patent is hereby corrected as shown below:

Column 2,
Line 62, replace "consuning" with -- consuming --.

Signed and Sealed this

Twenty-ninth Day of June, 2004

JON W. DUDAS
*Acting Director of the United States Patent and Trademark Office*